United States Patent
Lee et al.

(10) Patent No.: US 8,240,549 B2
(45) Date of Patent: Aug. 14, 2012

(54) IC PACKAGE TRAY EMBEDDED RFID

(75) Inventors: Jui-Chung Lee, Yun-Lin (TW);
Chun-Ming Ko, Hsinchu (TW);
Lan-Ben Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 37 days.

(21) Appl. No.: 12/511,243

(22) Filed: Jul. 29, 2009

(65) Prior Publication Data
US 2011/0024326 A1    Feb. 3, 2011

(51) Int. Cl.
*G06F 17/00*   (2006.01)
(52) U.S. Cl. ............ 235/375; 340/10.1; 340/572.1
(58) Field of Classification Search ............ 235/49, 235/380, 492, 375; 340/572.1, 572.3, 572.8, 340/505, 10.1, 10.52; 700/116, 95, 97, 103, 700/104, 106, 108, 109, 115, 121, 226; 438/166, 438/907, 925, 106; 206/701, 710, 714, 725; 198/345.3; 29/833; 257/E21.5, E21.52
See application file for complete search history.

(56) References Cited

U.S. PATENT DOCUMENTS

| | | | |
|---|---|---|---|
| 6,255,949 B1 | 7/2001 | Nicholson et al. | |
| 6,712,276 B1 | 3/2004 | Abali et al. | |
| 7,069,100 B2 * | 6/2006 | Monette et al. | 700/116 |
| 7,348,887 B1 | 3/2008 | Warner et al. | |
| 7,403,122 B1 | 7/2008 | Koepp et al. | |
| 2002/0014465 A1 * | 2/2002 | Chung | 211/126.1 |
| 2004/0094450 A1 * | 5/2004 | Whiteman et al. | 206/701 |
| 2006/0124752 A1 | 6/2006 | Posamentier | |
| 2006/0252873 A1 * | 11/2006 | Balfour | 524/500 |

FOREIGN PATENT DOCUMENTS
TW    200719239    5/2007
* cited by examiner

*Primary Examiner* — Daniel Hess
*Assistant Examiner* — Tabitha Chedekel
(74) *Attorney, Agent, or Firm* — Haynes Beffel & Wolfeld LLP (57) ABSTRACT

A carrier tray as described herein includes a container having pockets for holding electrical components such as integrated circuits during manufacturing, and a device coupled to the container for tracking usage of the carrier tray into and out of process chambers used for performing particular processes on the electrical components carried therein. Stations and methods of using the carrier tray are also described herein.

15 Claims, 9 Drawing Sheets

IC PACKAGE TRAY EMBEDDED RFID

BACKGROUND OF THE INVENTION

1. Field of the Invention

The present invention relates generally to a carrier tray used during manufacturing of electrical components, and more particularly to systems and methods of using the carrier tray which allow for reuse of the carrier tray a large number of times.

2. Description of Related Art

In the manufacture of electrical components such as semiconductor integrated circuit devices, the components are placed in carrier trays that house and protect the components from damage during various processing, production, testing and assembly station operations. The carrier trays can also orient the electrical components to ensure proper placement and alignment during testing and insertion onto a printed circuit board. The various station operations are typically carried out at geographically dispersed locations, which necessitate shipment of the components in the carrier trays.

The carrier trays experience the same environment as the electrical components being manufactured, including high temperature processes such as baking. To reduce manufacturing costs the carrier trays are typically reused a number of times during the manufacturing flow process. However, tray material integrity issues caused by the repeated exposure to processes impacts the yield of the electrical components carried therein, which limits the number of times the tray can safely be used.

These integrity issues include physical damage/change such as shrinkage, warping or cracking of the trays due to the thermal stresses caused by high temperature processes. This physical damage/change of the trays can induce damage to the electrical components carried therein, such as cracking of the packages and/or lead damage, resulting in yield loss. Repeated high temperature exposure and/or usage of old trays can also result in breakdown of the tray material which contaminates the electrical components, also resulting in yield loss.

As a result, reusing the trays during the many phases of manufacturing typically necessitates expending considerable time and cost inspecting and measuring the integrity of the carrier trays.

In addition, in the manufacturing process for electrical components such as integrated circuit devices, typically include multiple manufacturing facilities in geographically dispersed locations. Implementing a manufacturing tracking system that will track the usage of carrier trays in this type of a distributed manufacturing facility arrangement is difficult and costly.

It is therefore desirable to provide a carrier tray for use during manufacturing of electrical components, and stations and methods of using the carrier tray, which allow for reuse of the carrier tray a large number of times while addressing the time and cost associated with inspection of the carrier tray, while also addressing yield loss issues caused by overuse of the trays.

SUMMARY OF THE INVENTION

A carrier tray as described herein includes a container having pockets for holding electrical components such as integrated circuits during manufacturing, and a device coupled to the container for tracking usage of the carrier tray into and out of process chambers used for performing particular processes on the electrical components carried therein. Stations and methods of using the carrier tray are also described herein.

The device may be for example a radio frequency identification (RFIC) device, and includes an antenna, circuitry for transmitting and receiving signals, a processor, and memory adapted to store a counter value indicating a number of times the carrier tray has been passed into and out of the process chambers. The memory also stores instructions executable by the processor, including instructions for transmitting a signal containing the counter value in response to a request for the counter value, and for incrementing the counter value stored in memory in response to a command to increment the counter value.

Some problems caused by the aging of the tray material cannot be found by inspection and measurement processes. By storing the counter value in memory on the device of the carrier tray, an accurate and convenient measure of the usage of the carrier tray is provided which can be used to determine when to prevent the tray from use in further process chambers.

The counter value information present on the device improves the accuracy and convenience of tracking usage of the tray. A decision about whether to permit the use of the carrier tray in subsequent manufacturing processes can be determined quickly and conveniently by merely interrogating the device attached thereto, without incurring the cost and delay of extensive quality control measures or the detailed usage tracking of the tray in a distributed manufacturing facility arrangement.

Storing the counter value has a number of advantages over simply storing large data files indicating the detailed usage of the tray. For example, instead of having to read and update large data structures stored on the device or in a remote database, by using the counter value to track the usage of the tray a relatively small amount of data is stored, modified, and transmitted.

In embodiments, a date of manufacture of the tray can also be stored on the device. Since integrity issues caused by repeated exposure can be worsened as the tray material ages, in embodiments the date of manufacture can also be used to determine when the carrier should be scrapped. In some embodiments, the predetermined date used is dependent upon the counter value stored on the device, and/or the predetermined usage number used is dependent upon the date of manufacturing stored on the device. Alternatively, the predetermined usage number and the predetermined date may be independent of one another.

A station used during manufacturing of electrical components which includes passing a carrier tray as described above into and out of a process chamber is described herein. The station comprises a reader to read the counter value stored in the memory of the device of the carrier tray, and to determine whether the counter value is greater than a predetermined usage. The station further includes a process chamber for performing a particular process on the electrical components carried by the carrier tray. The station also includes a writer to transmit a command signal to increment the counter value stored in the memory of the device prior to the carrier tray continuing to subsequent stations.

A method for manufacturing electrical components which includes passing a carrier tray as described above into and out of a process chamber is described herein. The method includes reading the counter value stored in the memory of the device of the carrier tray to determine whether the counter value is greater than a predetermined usage number. The method further includes passing the carrier tray into the process chamber for performing a particular process on the electrical components if the counter value is not greater than the predetermined usage number. The method also includes incrementing the counter value stored in the memory of the device prior to passing the carrier tray into a subsequent process chamber.

Other aspects and advantages of the present invention can be seen on review of the drawings, the detailed description, and the claims which follow.

BRIEF DESCRIPTION OF THE DRAWINGS

FIG. 7 is a simplified diagram of a process chamber in which the tray (or bundle of trays) and the electrical components carried therein are passed into and out of.

DETAILED DESCRIPTION

A detailed description of embodiments of the present invention is provided with reference to FIGS. 1 to 9.

Figure 1:
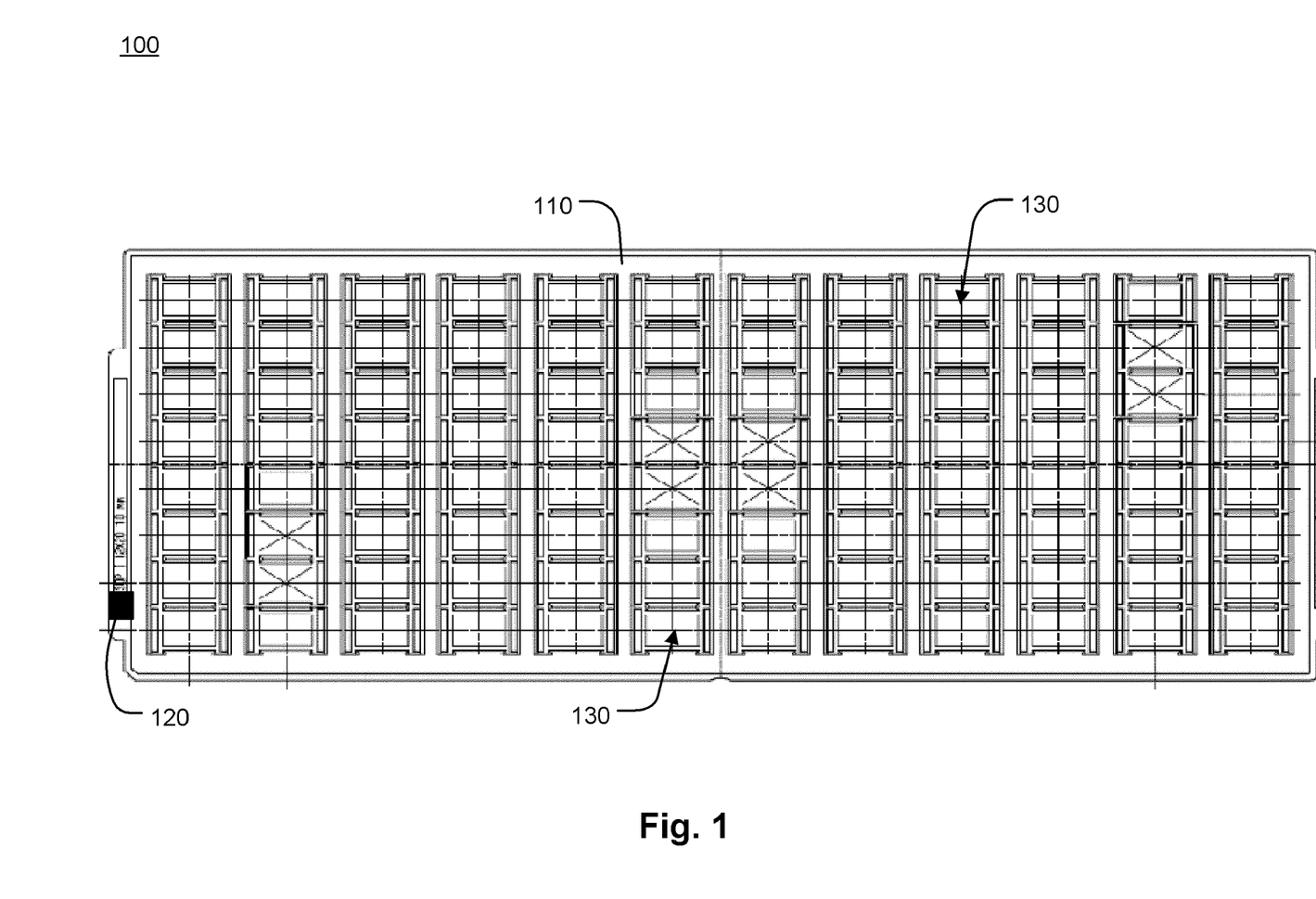
FIG. 1 is a plan view illustration of an embodiment of a carrier tray including a container used to hold electrical components such as integrated circuits during manufacturing, and an RFID device attached to or embedded within the material of the container.

FIG. 1 is a plan view illustration of an embodiment of a carrier tray 100 including a container 110 used to hold electrical components such as integrated circuits during manufacturing, and device 120 attached to or embedded within the material of the container 110. In the illustrated example, the device 120 is a radio frequency identification (RFID) device and includes software and circuitry to permanently store an identification code usable by an RFID reader or writer to identity the corresponding container 110. Alternatively, the device 120 is not an RFID device and other techniques for identifying the corresponding container 110 may be used. As described in more detail below, the RFID device 120 is used to track the number of times the carrier tray 100 has been passed into and out of process chambers.

The term "process chamber" as used herein broadly refers to a chamber having a space for the carrier tray 100 where certain process conditions are controlled and maintained for performing a particular process on the electrical components carried by the carrier tray 100. Examples include processes which expose the tray 100 and the electrical components carried therein to elevated temperatures, such as greater than or equal to 100 degrees Celsius, for extended periods of time. The time and temperature of the exposure will vary depending upon the particular details of the process performed. In embodiments an RFID writer associated with the process chamber can, for example, transmit a signal containing a command to increment the counter value stored in the memory of the RFID device of the tray upon powering up of the process chamber. Other techniques may alternatively be used.

The container 110 includes a series of pockets 130 for holding the electrical components. In the illustrated embodiment the pockets 130 are rectangular. Generally, the pockets 130 may be any suitable shape to accommodate the electrical components for which the container 110 is designed. The pockets 130 may include interior features designed to orient and protect the components from the interior surfaces of the pockets 130.

The container 110 can be formed from a variety of materials able to retain useful levels of strength and stiffness during exposure to temperatures encountered in component processing. In embodiments the material of the container 110 may comprise, for example, at least one of polyphenylene ether (PPE), modified polyphenylene oxide (MPPO), and polyethersulfone (PES). Other materials that have sufficient rigidity and temperature tolerances can be used as well.

Figure 2:
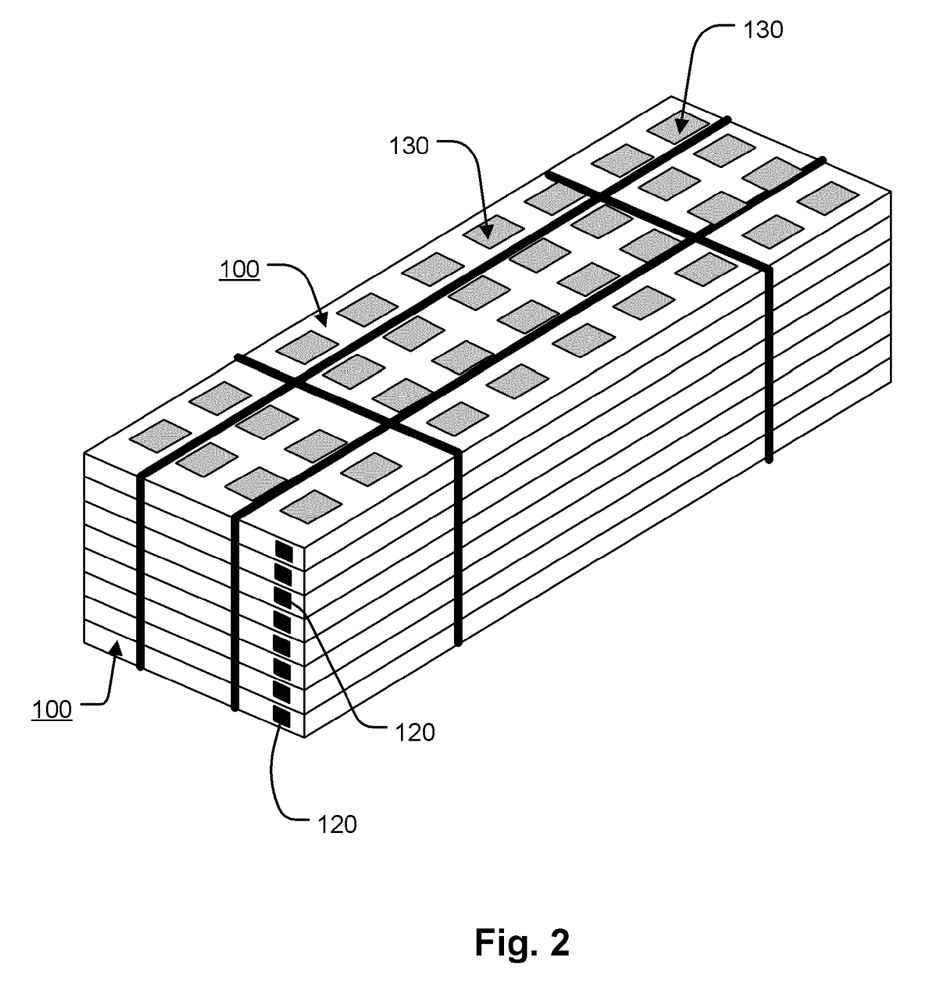
FIG. 2 is an illustration showing stacking of the carrier trays 100 in a bundle.

The container 110 can include exterior features to facilitate machine handling and/or stacking of the carrier trays 100 in a bundle. Stacking of the carrier trays 100 in a bundle is shown in the illustration of FIG. 2. The exterior features can be designed to meet standards of standards committees, such as EIA (Electronic Industries Association) and JEDEC (Joint Electronic Devices Engineering Council).

In order to form the container 110 with exterior features meeting standards and interior pockets 130 having features that will adequately accommodate the components therein, the container 110 can be manufactured, for example, using injection molding techniques.

The RFID device 120 is attached to or embedded within the material of the container 110. In FIG. 1 the RFID device 120 is located near the lower left edge of the container 110. Alternatively, the RFID device 120 may be located at other locations of the container 110.

The RFID device 120 includes software and circuitry to permanently store an identification code usable by an RFID reader or writer to identity the corresponding container 110, and other desirable information about the container 110 including a counter value indicating a number of times the container 110 been passed into and out of the process chambers. The software and circuitry of the RFID device 120 also interprets and processes signals received from RFID readers or writers, respond to requests for information, and provides for updating the information stored in its non-volatile memory. In the illustrated embodiment the RFID device 120 is passive and includes circuitry to derive its energy from signals provided by external RFID readers or writers.

Figure 3:
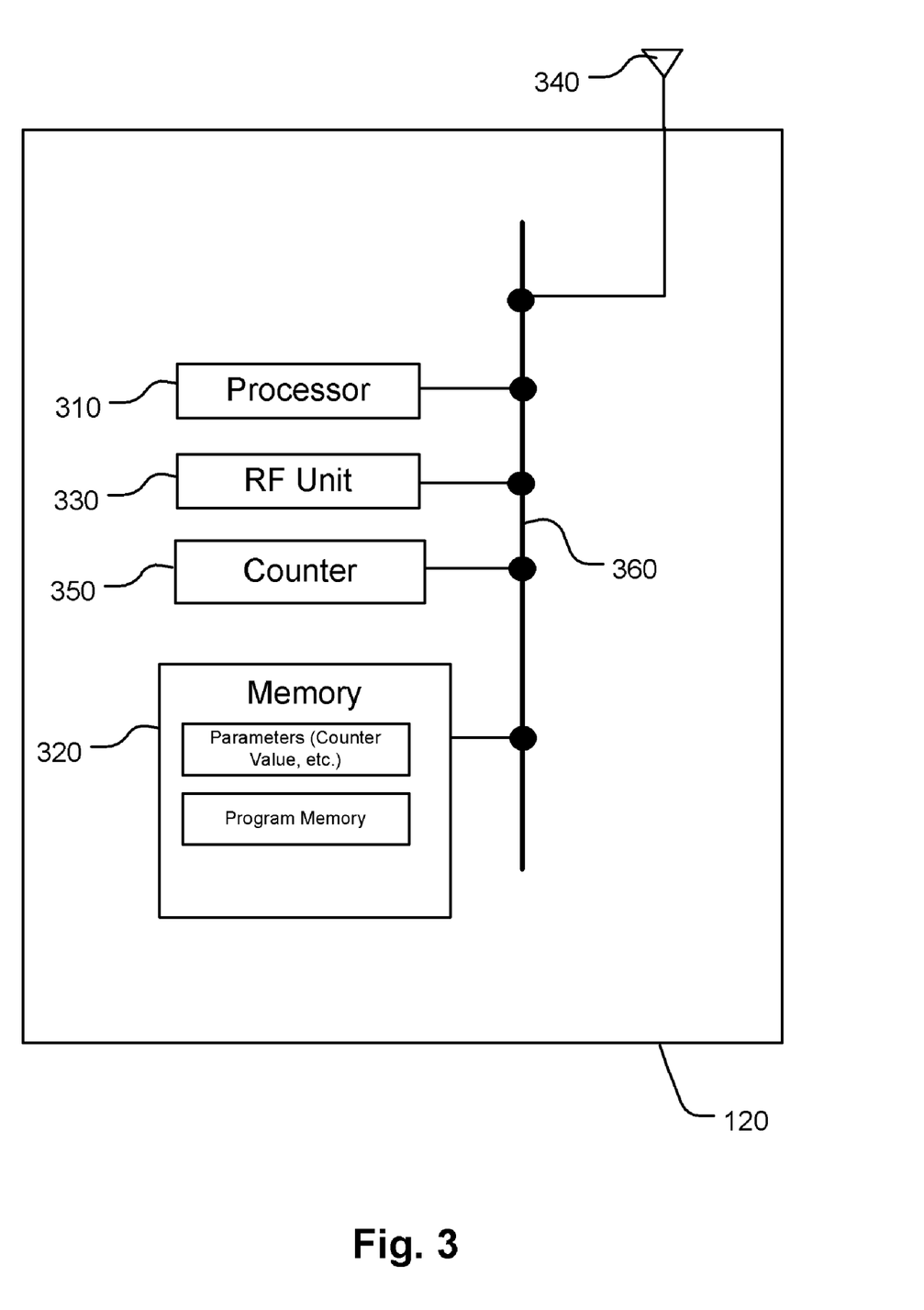
FIG. 3 is a simplified functional block diagram of an embodiment of the RFID device of the tray.

FIG. 3 is a simplified functional block diagram of an embodiment of the RFID device 120. As shown in FIG. 3, the RFID device 120 includes a processor 310, memory unit 320, RF unit 330, RF antenna 340, and a counter module 350, which may be coupled together by a system bus 360. Although not shown, the RFID device may also have other components. In embodiments all of the elements of the RFID device 120, including the antenna, may be implemented as a single integrated circuit. In yet other embodiments the antenna 340 may be implemented as an external component.

The RF unit 330 includes transmitter/receiver circuitry including modulators and demodulators for wirelessly transmitting and receiving signals via the antenna 340. The properties of the antenna 340 depend on the desired operating frequency of the RFID device 120.

The memory 320 stores an identification code used by an RFID reader or writer to identity the corresponding tray 100. The memory 320 also stores parameters including a counter value as described herein. The counter value indicates the number of times the tray 100 has been into and out of process chambers. As described in more detail below, the counter value stored in memory 320 can be read or incremented during the various stations in the manufacturing process of electronic components carried therein, and is used to determine when the tray 100 should be scrapped.

In some embodiments the memory 320 also stores a date of manufacture of the tray 100, which can be used to determine when the tray 100 should be scrapped.

The memory 320 also stores instructions in program memory that are executable by the processor 310 to carry out various functions described herein, including to take various actions in response to signals received from RFID readers and writers. These instructions are discussed in more detail below, and include instructions for transmitting a signal containing the counter value stored in memory 320 in response to a received request for the counter value, and instructions for incrementing the counter value stored in memory 320 in response to a received command.

During its useful life the tray 100 will encounter a variety of stations. These stations depend upon the processes performed during the manufacturing of the electronic components for which the tray 100 is designed to carry. Typically these stations include package assembly, electrical testing, and surface mount assembly, among others. The stations typically include process chambers which expose the tray 100 and the electrical components therein to elevated temperatures, such as greater than or equal to 100 degrees Celsius, for extended periods of time. The time and temperature of the exposure will vary depending upon the particular details of the process performed.

Processes performed can include, for example, baking to remove moisture during assembly of the electrical components, function testing of the components, and pre-surface mount bake processes. The manner in which the counter value is incremented depends upon the particular details of the processes of the process flow.

Figure 4:
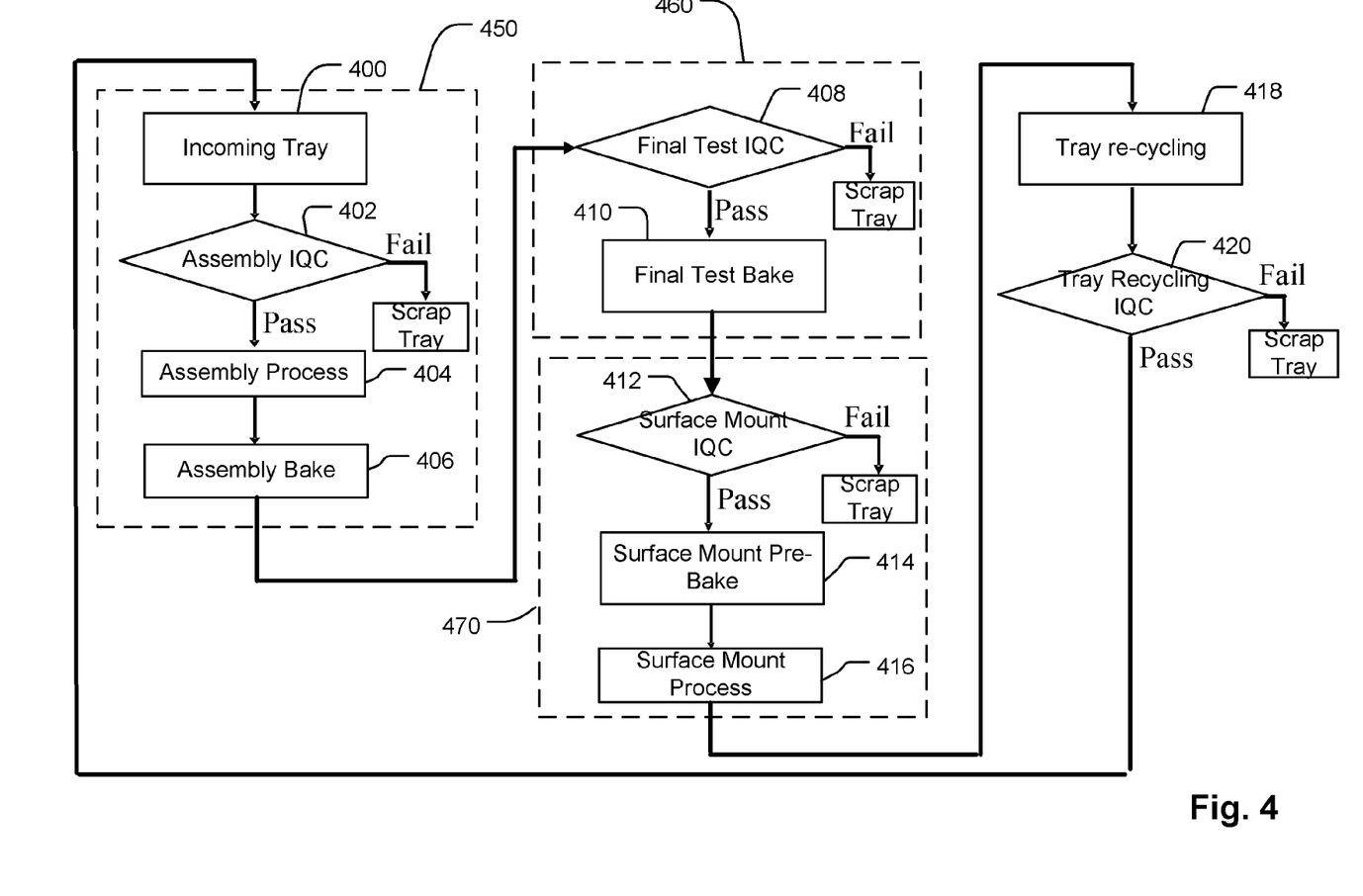
FIG. 4 illustrates a representative flow diagram of usage of the tray during the manufacturing of electrical components which the tray is designed to carry.

FIG. 4 illustrates a representative flow diagram of usage of the tray 100 during the manufacturing flow of electrical components which the tray 100 is designed to carry. It will be understood that the order and the processes shown in the flow diagram of FIG. 4 are examples, and the actual processes and the order performed will vary from embodiment to embodiment. The illustrated example includes stations for assembly 450, final test 460, and surface mount 470.

As illustrated, the flow diagram includes the tray 100 incoming to an assembly station 450 at block 400. Block 402 is an assembly inspection quality control (IQC) process in which the counter value stored in the memory of the RFID device 120 of the tray 100 is read by an RFID reader, to determine whether to the counter value is greater than a predetermined usage number indicating that the tray 100 should be removed from the process flow and scrapped.

Figure 5:
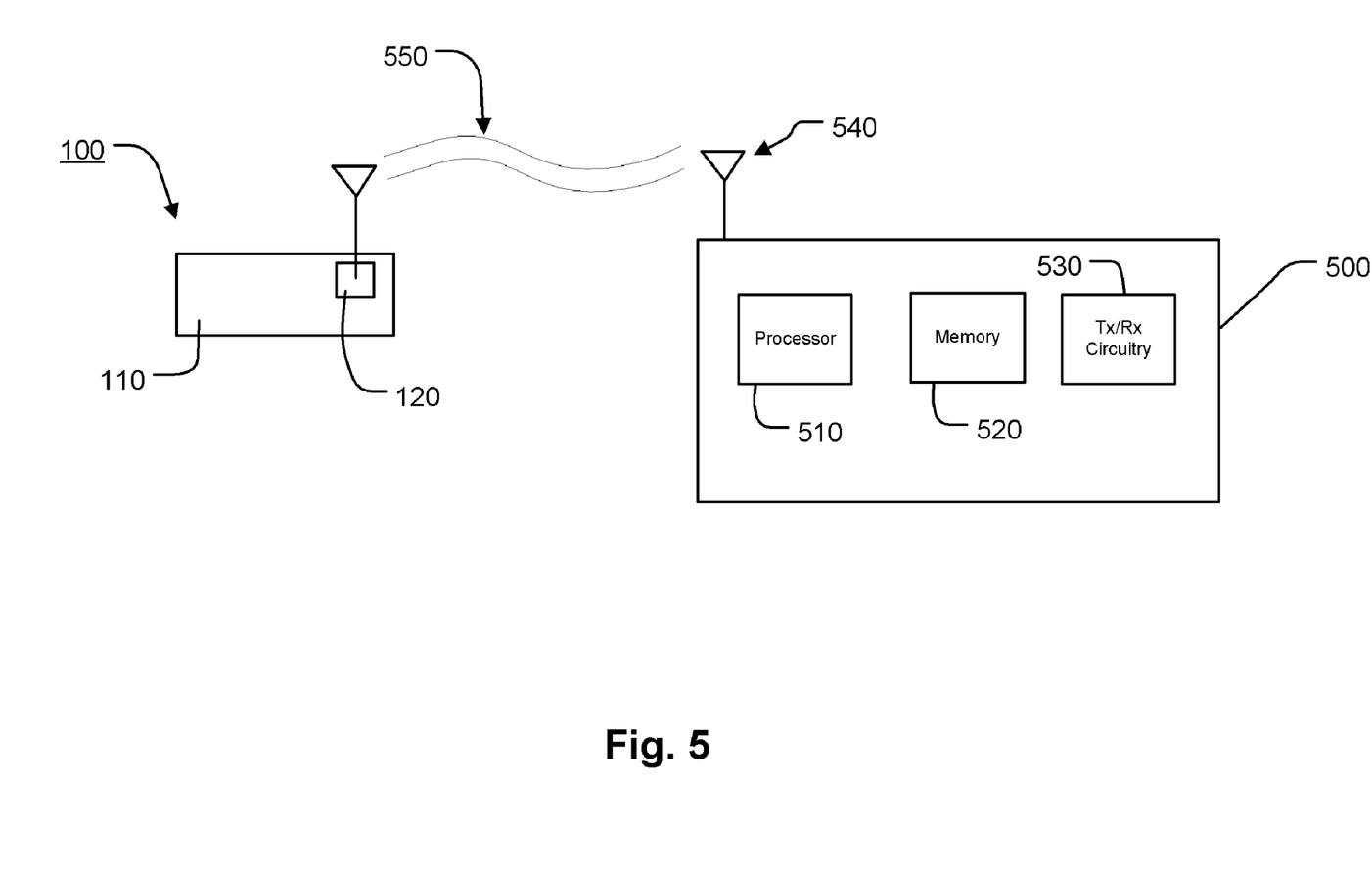
FIG. 5 illustrates the RFID device of the carry tray in communication with an RFID interrogator via a wireless communication medium during an inspection process.

Referring now to FIG. 5, the RFID device 120 of the carrier tray 100 is illustrated in wireless communication 550 with an RFID reader 500 during the inspection process of block 402.

The RFID reader 500 includes a processor 510 configured to execute instructions stored in memory 520 which control the operation of the RFID reader 500. The reader 500 also includes transmitter/receiver circuitry 530 to generate and encode signals to be transmitted by antenna 540, and to receive and decode signals received by antenna 540.

Figure 6:
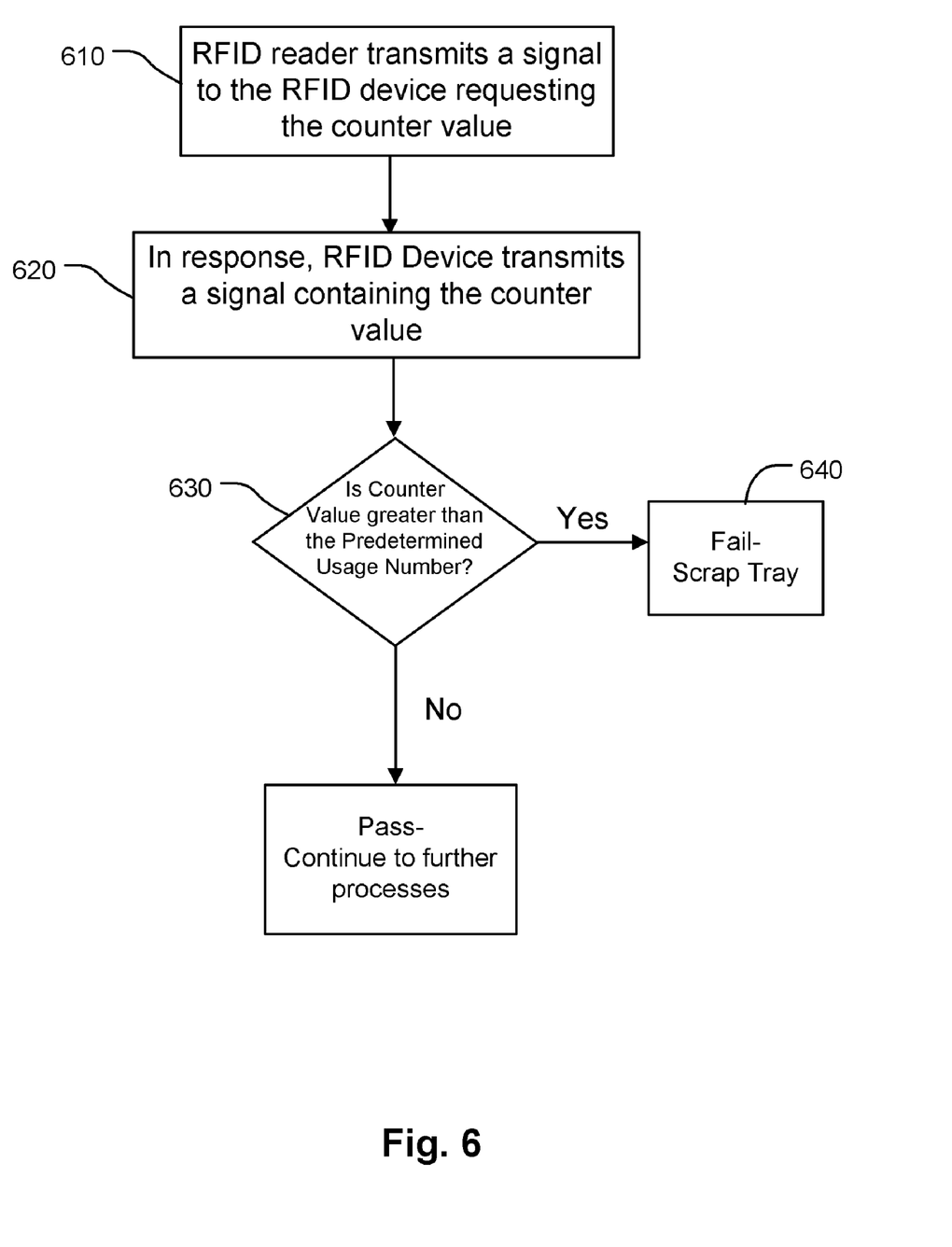
FIG. 6 is a flow diagram of an inspection process of the tray using an RFID interrogator.

FIG. 6 is a flow diagram of the inspection process 402 of the tray 100 using the RFID reader 500.

Once the tray 100 is placed in proximity of the RFID reader 500, the RFID reader 500 detects the tray 100 and at step 610 the reader 500 transmits a signal containing a request for the counter value stored in the memory of the RFID device 120 of the tray 100. The signal can be encoded.

Once the reader 500 transmits the signal containing the request, the signal propagates as an electromagnetic wave in free space towards the carrier tray 100. When the signal reaches the RFID device 120 of the tray 100, the RFID device 120 is powered by the signal, demodulates the signal, processes the request from the reader 500, and in response transmits a signal containing the counter value stored in memory (block 620).

The reader 500 receives the signal containing the counter value and demodulates the signal to extract the counter value. The reader 500 determines if the counter value is greater than a predetermined usage number (block 630). The predetermined usage number indicates the number of times the tray 100 will be passed into and out of process chambers before being scrapped. The predetermined usage number will vary from embodiment to embodiment, depending upon the material properties of the container 100, and the specific processes the tray 100 is exposed to during the manufacturing of the electronic components carried therein.

If the counter value is greater than the predetermined usage number, the tray 100 has failed the inspection process 402 and is scrapped (block 640). In one embodiment, a message is sent by the reader 500 to a beeper or other audible device to notify an operator to scrap the tray. In another embodiment, the reader 500 may transmit a signal to a display viewable by the operator which indicates the number of usages remaining before the tray reaches the predetermined usage number. In yet another embodiment, the reader 500 may transmit a signal to a robotic device movable to engage the tray 100, to move the tray 100 to a pre-selected area indicating the tray 100 is to be scrapped.

If the counter value stored in memory is not greater than the predetermined usage number, the tray passes the inspection process 402 and continues to be used in further processes.

Referring back to the flow chart of FIG. 4, if the tray 100 has passed the inspection process 402, electrical components are placed in the pockets of the tray 100 (block 404). The assembly process of block 404 for the electrical components, such as semiconductor integrated circuit devices, typically includes mechanically and electrically connecting the devices to a package.

At block 406, the tray 100 and the electrical components carried therein are placed in a process chamber to perform a baking process to remove excess moisture from the electrical components. The baking process of block 406 can be carried out in any suitable process chamber, such as an oven.

Figure 7:
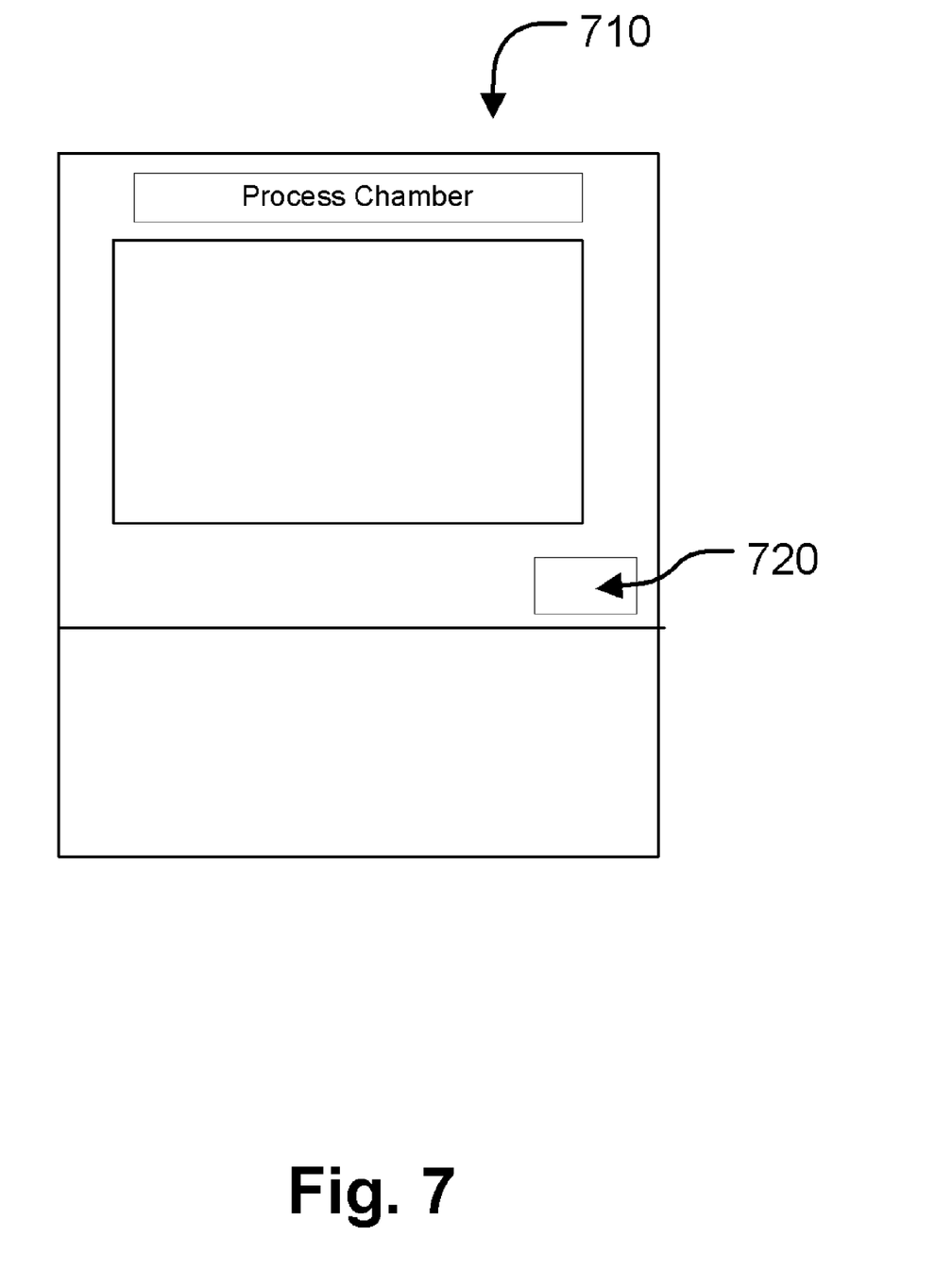

FIG. 7 is a simplified illustration of the baking process chamber 710 in which the tray 100 (or a bundle of trays) and the electrical components carried therein are placed into to perform the baking process, and then subsequently removed. The duration and temperature of the baking process depend upon the level of moisture in the components, the relatively humidity of the temperature chamber, and the acceptable level of moisture in the components after baking. Example temperature ranges include 100 to 125 degrees Celsius or more, for durations for example of 4, 6, 8, 10 or 24 hours.

The simplified illustration of FIG. 7 includes an RFID writer 720 to increment the counter value stored in the memory of the RFID device 120 prior to the carrier tray 100 continuing to subsequent stations in the process flow. In the illustrated example the RFID writer 720 is on the temperature chamber 710. Alternatively, the RFID writer 720 and the temperature chamber 710 may be separated.

The various elements of the RFID writer 720 can be similar to the RFID reader 500 described above with respect to FIG. 5, and includes a processor configured to execute instructions stored in memory which control the operation of the RFID writer 720. The writer 720 also includes transmitter/receiver circuitry to generate and encode signals to be transmitted by an antenna, and to receive and decode signals received by the antenna.

Figure 8:
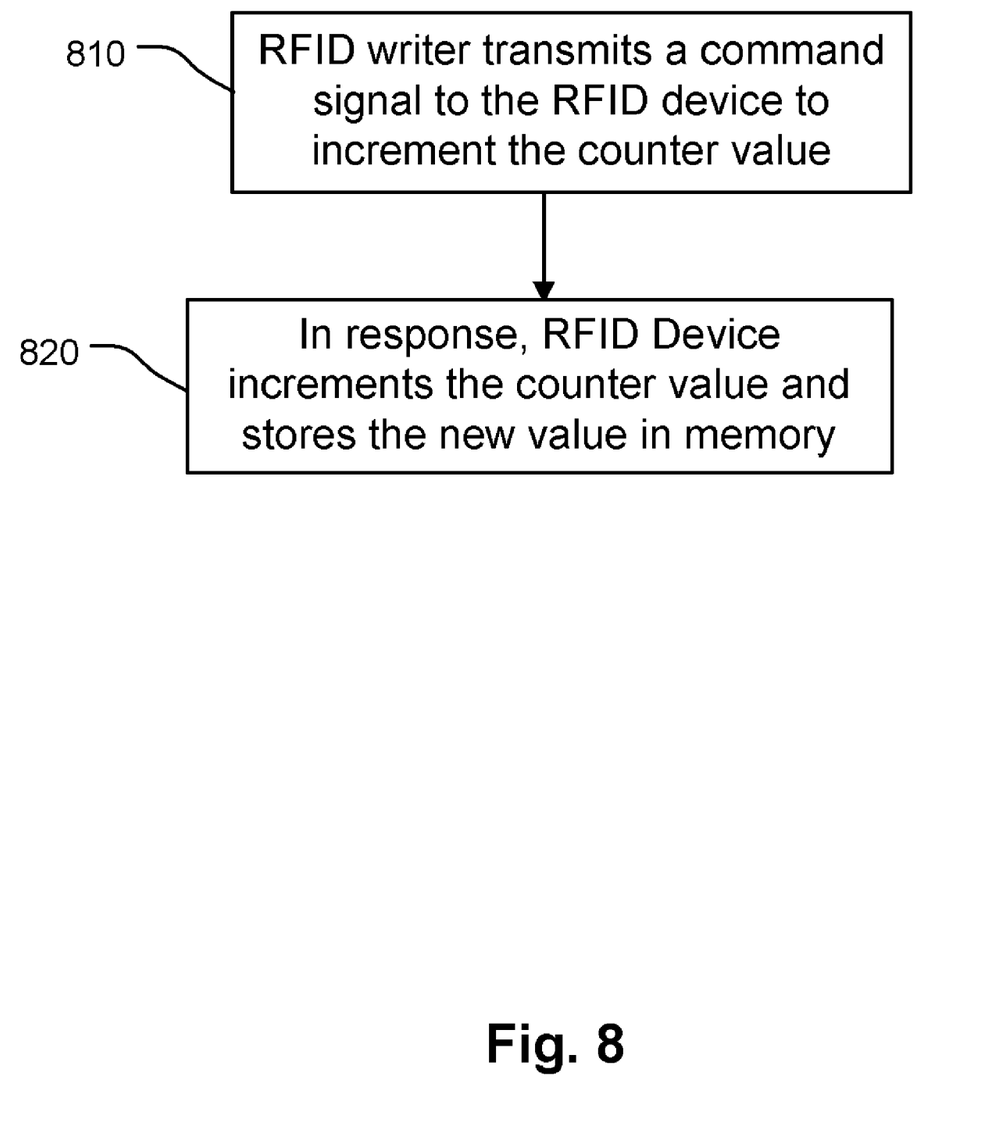
FIG. 8 is a flow diagram of using the interrogator to increment the counter value stored in memory of the RFID device of the tray.

FIG. 8 is a flow diagram of using the writer 720 to increment the counter value stored in memory of the RFID device of the tray 100.

At step 810 the RFID writer 720 transmits a signal containing a command to increment the counter value stored in the memory of the RFID device 120 of the tray 100. The signal can be encoded according to one of several common schemes.

Step 810 may be initiated, for example, upon powering up the process chamber 710 at the beginning of the baking process. Alternative techniques for initiating step 810 may also be used.

Once the RFID writer 720 transmits the signal containing the command, the signal propagates as an electromagnetic wave in free space towards the carrier tray 100. When the signal reaches the RFID device 120 of the tray 100, the RFID device 120 is powered by the signal, demodulates the signal, processes the command from the RFID writer 720, and increments and stores the new value in memory (block 820).

In addition, following the baking operation the process may include requesting the new counter value stored in the memory of the RFID device 120 of the tray 100, to determine whether the counter value is now greater than the predetermined usage number and the tray 100 needs to be scrapped.

Referring back to the flow chart of FIG. 4, the electrical components and the tray 100 continue from the assembly station 450 to a final test station 460. The final test station 460 may at a geographically dispersed location from that of the assembly station 450, which necessitates shipment of the components in the carrier tray 100.

Block 408 is a final test inspection quality control (IQC) process, in which the counter value stored in memory is read to determine whether the counter value is greater than a predetermined usage number indicating that the tray 100 should be removed from the process flow and scrapped. The process of block 408 can be carried out in a similar manner to the inspection process of block 402 discussed above.

If the tray 100 successfully passes the inspection process 408, at block 410 the tray 100 and the electronic components carried therein are placed in a process chamber to perform a final test baking process, and the counter value stored in memory of the RFID device of the tray 100 is incremented. The final test baking process and the incrementing of the counter value can be carried out in a similar manner to the process of block 406 discussed above. The duration and temperature of the final test baking process will vary from embodiment to embodiment.

The electrical components and the tray 100 then continue from the final test station 460 to a surface mount assembly station 470. The final test station 460 may at a geographically dispersed location from that of the surface mount assembly station 470, which necessitates shipment of the components in the carrier tray 100.

Block 412 is a surface mount inspection quality control (IQC) process in which the counter value stored in memory of the RFID device of the tray 100 is read to determine whether the counter value is greater than a predetermined usage number indicating that the tray 100 should be removed from the process flow and scrapped. The process of block 412 can be carried out in a similar manner to the process of block 402 discussed above.

If the tray 100 successfully passes the inspection process 412, at block 414 the tray 100 and the electrical components therein are placed in a process chamber to undergo a pre-surface mount baking process, and the counter value stored in memory of the RFID device of the tray 100 is incremented. The pre-surface mount baking process and the incrementing of the counter value can be carried out in a similar manner to the process of block 406. The duration and temperature of the pre-surface mount baking process depend upon a number of factors, and will vary from embodiment to embodiment. Typically during the burn-in process an electrically conductive material, such as solder paste, is applied to the leads of the electrical components carried by the tray 100, and the tray 100 and electrical components undergo a pre-mount thermal cycling heat stress to cure the solder paste.

Next, the electrical components are removed from the tray 100 and attached on a support, such as a printed circuit board (block 416). The tray 100 is shipped to a tray re-cycling station (block 418). Block 420 is a tray recycling house inspection quality control (IQC) process in which the counter value stored in memory of the RFID device of the tray 100 is read to determine whether to remove the tray 100 from the process flow and scrap it. The process of block 420 can be carried out in a similar manner to the process of block 402 discussed above. If the tray passes the inspection process 420, the tray 100 then continues back to the assembly process station 450 for use in the manufacturing of additional electrical components.

If the tray does not pass the inspection process 420, the tray is scrapped. In embodiments the device attached to or embedded within the material of the container may be removed, so that the device may be reused.

The manufacturing process for electrical components, such as integrated circuits, typically includes multiple manufacturing facilities in geographically dispersed locations. Implementing a manufacturing tracking system that will track the usage of carrier trays in this type of a distributed manufacturing facility arrangement is difficult and costly. By using the tray 100 including an RFID device storing a counter value as described herein, the process of inspecting and tracking the usage of the carrier trays is greatly simplified.

In some embodiments the counter value stored in the RFID device is increased by the same number (for example, 1) during each of the processes the tray 100 undergoes. However, the amount of stress the tray 100 experiences can depend upon the particular details of the processes performed, such as the number of temperature cycles performed, the maximum temperature, the time duration, among others. Thus, in some embodiments, the amount the counter value is incremented various depending upon the details of the process, in order to account for the variation in stress the tray 100 will experience. For example, in a manufacturing flow which includes a first process of 100 degrees Celsius for 2 hours, and a second baking process of 150 degrees Celsius for 4 hours, the counter value can be incremented by 1 when the first baking process is performed and incremented by 2 when the second baking process is performed.

In the illustrated example of FIG. 4, to determine if the tray 100 should be scrapped the counter value was read prior to passing the carrier tray 100 into a process chamber to perform each of the various processes. Alternatively, the number of inspection processes is less than the number of times the tray is passed into and out of process chambers during the process flow. In such an example, during each of the inspection processes a read processes is performed to determined whether the tray is usable for all of the subsequent process that will occur before the next inspection process is performed. If not, the tray is scrapped.

Depending upon the particular details of the process flow, if it is determined that the tray 100 needs to be scrapped, the individual electrical components will likely have to be removed from the tray 100 and placed in a different tray 100. Aside from being a time consuming task, this extra handling can result in damage to electrical components that could have been avoided had they remained within the pockets of the carrier 110. Thus, in some embodiments, a single inspection process is performed at a particular step in the overall process flow, to minimize or eliminate having to move the electrical components from one tray to another. For example the single inspection process may be performed at the assembly inspection quality control (IQC) process of block 402. This eliminates the need to remove and handle the electrical components individually during their manufacturing, which reduces the possibility of damage to the components. In such an example, the inspection process determines whether the tray should be scrapped by determining whether the tray 100 is usable for each of the processes to be performed prior to the tray 100 returning to the inspection process.

In the illustrated example discussed above, the counter value stored in the RFID device was used to determine whether to scrap the tray. In some embodiments, additional data stored in the RFID may also be used to determine when to scrap the tray. For example, material integrity issues of the carrier 110 caused by the repeated exposure in the process chambers can be worsened as the material ages.

Figure 9:
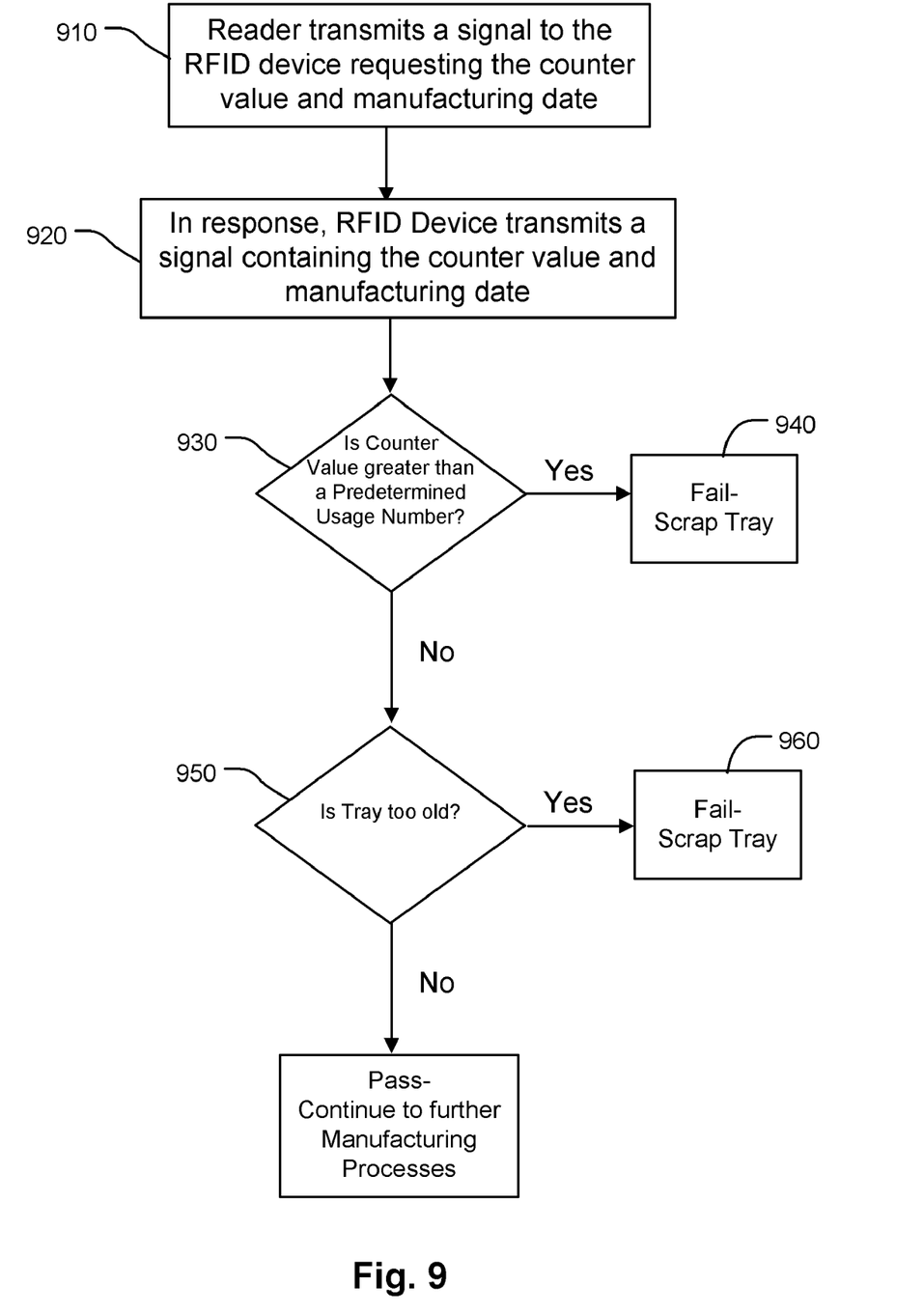
FIG. 9 is a flow diagram of an alternative inspection process to that of FIG. 6, in which a date of manufacture of the container is stored in the memory of the RFID device and is also used to determine when to scrap the tray.

FIG. 9 is a flow diagram of an alternative inspection process to that of FIG. 6, in which a date of manufacture of the tray 100 is stored in the memory of the RFID device and is also used to determine when to scrap the tray 100.

Once the tray 100 is placed in proximity of the RFID reader 500, the interrogator detects the tray 100 and at step 910 the RFID reader 500 transmits a signal containing a request for the counter value and the date of manufacture stored in the memory of the RFID device of the tray 100. The signal can be encoded according to one of several common schemes.

Once the reader 500 transmits the signal containing the request, the signal propagates as an electromagnetic wave in free space towards the carrier tray 100. When the signal reaches the RFID device 120 of the tray 100, the RFID device 120 is powered by the signal, demodulates the signal, processes the request command from the interrogator 500, and transmits a signal containing the counter value and the date of manufacture (block 920).

The reader 500 receives the signal containing the counter value and the date of manufacture, demodulates the signal to extract the counter value and date of manufacture. The reader 500 determines if the counter value is greater than a predetermined usage number (block 930). If the counter value is greater than the predetermined usage number, the tray has failed the inspection process and is scrapped (block 940). The RFID reader 500 also determines if the date of manufacture of the tray 100 is earlier (block 950) than a predetermined date set by the operator, and if so the tray 100 is removed from the manufacturing process and scrapped (block 960).

If the counter value stored in memory of the RFID device 120 is not greater than the predetermined usage number, and if the date of manufacture of the tray 100 is not earlier than the predetermined date, the tray 100 passes the inspection process and continues to be used in further processes.

In FIG. 9 the tray 100 was scrapped based on both the predetermined usage number of block 930 and the predetermined date of block 950. Since material integrity issues of the carrier 110 caused by the repeated exposure can be worsened as the material ages, in some embodiments the predetermined date used is dependent upon the counter value stored on the device 120, and/or the predetermined usage number may be dependent upon the manufacturing date stored on the device 120. In one such example, the counter values and the corresponding predetermined dates can be stored in a look-up table in the memory of the interrogator, and used to determine when to scrap the tray 100. Alternatively, the predetermined usage number and the predetermined date may be independent of one another.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A carrier tray used during manufacturing of electrical components which includes passing the carrier tray into and out of process chambers, the carrier tray comprising:
  a container having pockets used to hold a set of the electrical components; and
  a radio frequency identification (RFID) device on the container which withstands exposure to temperatures, the RFID device comprising:
    a processor;
    an RF unit comprising a transmitter/receiver circuitry;
    an antenna operably coupled to the RF unit;
    a memory storing a counter value and instructions executable by the processor;
    a counter module capable of generating a counter value for storage in the memory;
    the processor, RF unit, counter module and memory coupled by a bus; and
    the counter value indicating a cumulative count indicating a duration of exposure of the container to temperatures greater than or equal to 100 degrees Celsius in the process chambers for a first set of the electrical components and for a second set of the electrical components.

2. The tray of claim 1, wherein:
  the instructions include instructions for transmitting a signal containing the counter value in response to a request for the counter value, and for incrementing the counter value stored in the memory in response to a command to increment the counter value.

3. The tray of claim 2, wherein:
  a date of manufacture of the tray is further in the memory; and
  the instructions include instructions for transmitting a signal containing the date of manufacture in response to a request for the date of manufacture.

4. The tray of claim 1, wherein material of the container comprises at least one of polyphenylene ether, modified polyphenylene oxide, and polyethersulfone.

5. A plurality of stations in a manufacturing process of electrical components which includes passing a carrier tray into and out of a process chamber at each of said plurality of stations, the carrier tray comprising a container having pockets used to hold a set of the electrical components and a device on the container, the device including a counter value in memory indicating a cumulative number of times the container has been passed into and out of process chambers for a first set of the electrical components and for a second set of the electrical components, each said station comprising:

- a reader to read the counter value stored in the memory of the device of the carrier tray, and to determine whether the counter value is greater than a predetermined usage number;
- a process chamber for performing a particular process on the electrical components carried by the carrier tray; and
- a writer to transmit a command signal to increment the counter value stored in the memory of the device prior to the carrier tray continuing to a subsequent station only when the carrier is exposed a temperature in the process chamber greater than or equal to 100 degrees Celsius.

6. The plurality of stations of claim 5, wherein said device is a radio frequency identification (RFID) device.

7. The plurality of stations of claim 5, wherein:
- a date of manufacture of the carrier tray is further in memory; and
- the reader to read the date of manufacture of the carrier tray stored in the memory of the device, and to determine whether the date of manufacture is earlier than a predetermined date.

8. The plurality of stations of claim 7, wherein the predetermined date is dependent upon the counter value stored in the memory of the device.

9. The plurality of stations of claim 7, wherein the predetermined usage number is dependent upon the date of manufacture stored in the memory of the device.

10. A method for manufacturing electrical components which includes carrying electrical components in a carrier tray during a sequence of manufacturing processes, the carrier tray comprising a device including memory, the method comprising:

- maintaining a counter value in the memory indicating a duration of exposure of the carrier tray to temperatures greater than or equal to 100 degrees Celsius in manufacturing processes involved in manufacturing electrical components held by the carrier tray;
- before loading electrical components into the carrier tray, reading the counter value stored in the memory of the device of the carrier tray to determine whether the counter value is greater than a predetermined usage number; and
- if the counter value is not greater than the predetermined usage number:
  - load electrical components into the carrier tray,
  - pass the carrier tray into a process chamber for performing a particular process on the electrical components carried by the carrier tray, and
  - increment the counter value only if the carrier is exposed to a temperature greater than equal to 100 degrees Celsius during the particular process.

11. The method of claim 10, wherein said device is a radio frequency identification (RFID) device.

12. The method of claim 10, wherein the memory of the device is further adapted to store a date of manufacture of the carrier tray, and further comprising reading the date of manufacture of the carrier tray to determine whether the date of manufacture is earlier than a predetermined date, wherein said carrier tray pass step includes passing the carrier tray into the process chamber if the date of manufacture is not earlier than the predetermined date.

13. The method of claim 12, wherein the predetermined date is dependent upon the counter value stored in the memory of the device.

14. The method of claim 12, wherein the predetermined usage number is dependent upon the date of manufacture stored in the memory of the device.

15. The method of claim 10, including:
- before passing the carrier tray into a further process chamber, reading the incremented counter value stored in the memory to determine whether the incremented counter value is greater than the predetermined usage number;
- if the incremented counter value is not greater than a predetermined usage number, pass the carrier tray into the further process chamber for performing a further process on the electrical components carried by the carrier tray;
- further incrementing the incremented counter value following the further process on the electrical components carried by the carrier tray only if the carrier is exposed to a temperature greater than or equal to 100 degrees Celsius during the further process;
- reading the further incremented counter value to determine whether the further incremented counter value is greater than the predetermined usage number; and
- if the further incremented counter value has reached the predetermined usage number, remove the electrical components from the carrier tray.

* * * * *